(12) United States Patent
Lee et al.

(10) Patent No.: US 12,500,102 B2
(45) Date of Patent: Dec. 16, 2025

(54) SUBSTRATE PROCESSING APPARATUS AND SUBSTRATE MONITORING METHOD

(71) Applicant: TES CO., LTD, Yongin-si (KR)

(72) Inventors: Jong-Seok Lee, Yongin-si (KR); Seung-Min Oh, Yongin-si (KR); In-Il Jung, Yongin-si (KR)

(73) Assignee: TES CO., LTD, Yongin-si (KR)

( * ) Notice: Subject to any disclaimer, the term of this patent is extended or adjusted under 35 U.S.C. 154(b) by 68 days.

(21) Appl. No.: 18/525,785

(22) Filed: Nov. 30, 2023

(65) Prior Publication Data
US 2024/0186159 A1 Jun. 6, 2024

(30) Foreign Application Priority Data
Dec. 5, 2022 (KR) .................. 10-2022-0168229

(51) Int. Cl.
*H01L 21/67* (2006.01)
*H01L 21/02* (2006.01)
*H01L 21/687* (2006.01)

(52) U.S. Cl.
CPC .. *H01L 21/67253* (2013.01); *H01L 21/67017* (2013.01); *H01L 21/67034* (2013.01); *H01L 21/68742* (2013.01); *H01L 21/68785* (2013.01); *H01L 21/02101* (2013.01); *H01L 21/6704* (2013.01)

(58) Field of Classification Search
CPC ............ G01R 27/02–22; H01L 21/683–68792
See application file for complete search history.

(56) References Cited

U.S. PATENT DOCUMENTS

| | | | |
|---|---|---|---|
| 2008/0125342 A1* | 5/2008 | Visintin | C11D 3/08 257/E21.646 |
| 2009/0097185 A1 | 4/2009 | Shannon et al. | |
| 2018/0209062 A1* | 7/2018 | Nagai | C25D 17/001 |
| 2022/0262602 A1* | 8/2022 | Kwon | H01J 37/32568 |
| 2022/0336297 A1* | 10/2022 | Cheng | C23C 14/548 |

FOREIGN PATENT DOCUMENTS

| | | |
|---|---|---|
| JP | WO2022196384 A1 * | 9/2022 |
| KR | 10-2013-0010527 A | 1/2013 |
| KR | 10-2017-0115899 A | 10/2017 |
| KR | 10-2021-0018067 A | 2/2021 |

OTHER PUBLICATIONS

Wikipedia, "four-terminal sensing," archived on Aug. 24, 2021 (Wayback Machine), available at https://web.archive.org/web/20210824215735/https://en.wikipedia.org/ wiki/Four-terminal_ sensing. (Year: 2021).*

* cited by examiner

*Primary Examiner* — Kaj K Olsen
*Assistant Examiner* — Richard Z. Zhang
(74) *Attorney, Agent, or Firm* — Park, Kim & Suh, LLC

(57) ABSTRACT

Provided is a substrate processing apparatus including a chamber providing a processing space in which a process is performed on a substrate coated with an organic solvent using a fluid in a supercritical state, a tray unit supporting the substrate and provided to be inserted into the chamber and withdraw from the chamber through an opening of the chamber, and a detector configured to measure a resistance of the substrate.

8 Claims, 16 Drawing Sheets

SUBSTRATE PROCESSING APPARATUS AND SUBSTRATE MONITORING METHOD

CROSS-REFERENCE TO RELATED APPLICATION

This application is based on and claims priority under 35 U.S.C. § 119 to Korean Patent Application No. 10-2022-0168229, filed on Dec. 5, 2022, in the Korean Intellectual Property Office, the disclosure of which is incorporated by reference herein in its entirety.

TECHNICAL FIELD

The present disclosure relates to a substrate processing apparatus and a substrate monitoring method, and more particularly, to a substrate processing apparatus and a substrate monitoring method, for detecting at least one of a progress of a process on a substrate and the amount of an organic solvent on the substrate when a process such as a drying process is performed on the substrate using a supercritical fluid.

BACKGROUND

Generally, when large-scale/high-density semiconductor devices such as large-scale integration (LSI) is manufactured on a surface of a semiconductor wafer, there is a need to form an ultrafine pattern on a wafer surface.

Such an ultrafine pattern may be formed by performing various processes such as exposure, development, and cleaning on a wafer coated with a resist, patterning the resist, and then etching the wafer to transfer a resist pattern on the wafer.

After such etching, the wafer is cleaned to remove dusts or a natural oxide film on the wafer surface. Cleaning processing is performed by immersing the wafer with a pattern formed on a surface thereof in a processing liquid such as a chemical solution or a rinse liquid, or by supplying the processing liquid to the wafer surface.

However, as semiconductor devices become more highly integrated, pattern collapse, in which the pattern on the resist or wafer surface collapses, occurs when the processing liquid is dried after cleaning.

As shown in FIG. 11, this pattern collapse corresponds to a phenomenon in which the patterns 11, 12, and 13 collapse in a direction toward a side in which a large amount of a processing liquid or organic solvent 10 (hereinafter referred to as organic solvent) remains because capillary force for stretching the patterns 11, 12, and 13 from side to side is unbalanced if the organic solvent on the left and right sides of the patterns 11, 12, and 13 is unevenly dried when the organic solvent remaining on a surface of the substrate S is dried after finishing the cleaning processing.

FIG. 11 shows a state in which drying of the organic solvent on left and right outer regions in which patterns are not formed on the upper surface of the substrate S is completed, while the organic solvent 10 remains in gaps between the patterns 11, 12, and 13. As a result, the patterns 11 and 13 on both the left and right sides collapse inward due to the capillary force received from the organic solvent 10 remaining between the patterns 11, 12, and 13.

The capillary force that causes the pattern collapse described above is due to the surface tension of the processing liquid that acts at a liquid/gas interface between the atmospheric atmosphere surrounding the substrate S after cleaning and the organic solvent between the patterns.

Therefore, recently, a processing method of drying the organic solvent using a fluid in a supercritical state (hereinafter referred to as 'supercritical fluid') that does not form an interface between gas or liquid has attracted attention.

In a conventional drying method using only temperature control in a state diagram of pressure and temperature of FIG. 12, a gas-liquid equilibrium line is necessarily passed, and at this time, a capillary force is generated at a gas-liquid interface.

On the other hand, when a substrate is dried through a supercritical state using both temperature and pressure control of a fluid, the gas-liquid equilibrium line is not passed, and it may be possible to dry the substrate in a state essentially free of capillary force.

Referring to drying using a supercritical fluid with reference to FIG. 12, when the pressure of a liquid is raised from A to B and the temperature is then raised from B to C, the liquid is converted into a supercritical state C without passing the vapor-liquid equilibrium line. When the drying process is completed, the pressure of the supercritical fluid is lowered and the supercritical fluid is converted to gas D without passing the gas-liquid equilibrium line.

As described above, when a process such as a drying process for a substrate is performed using a supercritical fluid, pressurization and depressurization are repeated using a high-pressure fluid of approximately 10 MPa or more inside the chamber, and thus it is not easy to accurately detect a progress of the process or an end time of the process. This is because it is difficult to accurately measure the remaining amount of organic solvents such as isopropyl alcohol (IPA) on the substrate located inside a chamber.

SUMMARY

To overcome the above problem of the present disclosure, an object of the present disclosure is to provide a substrate processing apparatus and a substrate monitoring method, for monitoring a progress of a process in real time and accurately detecting the amount of organic solvent on a substrate when a process such as a drying process for a substrate is performed using a supercritical fluid.

According to an aspect of the present disclosure, a substrate processing apparatus includes a chamber providing a processing space in which a process is performed on a substrate coated with an organic solvent using a fluid in a supercritical state, and a tray unit supporting the substrate and provided to be inserted into the chamber and withdraw from the chamber through an opening of the chamber, and a detector configured to measure a resistance of the substrate.

The detector may detect at least one of a progress of a process for the substrate and an amount of the organic solvent on the substrate.

The detector may measure the resistance of the substrate with the tray unit.

The tray unit may further include a tray supporting the substrate, and a cover provided at an end of the tray and sealing the opening, and the detector may be connected to the cover.

The tray unit may further include a tray supporting the substrate, and a plurality of protruding terminals that protrude from an upper surface of the tray and are connected to the detector and on which the substrate is placed.

The substrate processing apparatus may further include a lift pin loading the substrate into the tray unit or unloading the substrate from the tray unit, wherein the detector may be connected to the lift pin.

The detector may include an ammeter configured to measure a current of an object and a voltmeter configured to measure a voltage.

According to an aspect of the present disclosure, a substrate monitoring method of a substrate processing apparatus including a chamber in which a process is performed on a substrate coated with an organic solvent using a fluid in a supercritical state includes measuring a resistance of the substrate and detecting at least one of a progress of a process for the substrate and an amount of the organic solvent on the substrate according to the measured resistance value.

A resistance value of the substrate may be measured before the process for the substrate is performed, and the measured resistance value may be compared with a predetermined first threshold value to determine whether an amount of the organic solvent applied to the substrate corresponds to a predetermined amount.

The first threshold value may be determined by adding a predetermined margin to the resistance value of the substrate coated with the predetermined amount of organic solvent.

A resistance value of the substrate may be measured during the process for the substrate, and when the measured resistance value is equal to or greater than a predetermined second threshold value, the process for the substrate may be determined to be completed.

A resistance value of the substrate may be measured after the process for the substrate is completed, and the measured resistance value may be compared with a predetermined second threshold value to determine whether the process for the substrate is normally completed.

The second threshold value may be determined by adding a predetermined margin to the resistance value of the substrate from which the organic solvent is removed.

BRIEF DESCRIPTION OF THE DRAWINGS

Embodiments will be more clearly understood from the following detailed description taken in conjunction with the accompanying drawings in which.

DETAILED DESCRIPTION OF THE EMBODIMENTS

Hereinafter, the configuration of a substrate processing apparatus according to an embodiment of the present disclosure will be described in detail.

Figure 1:
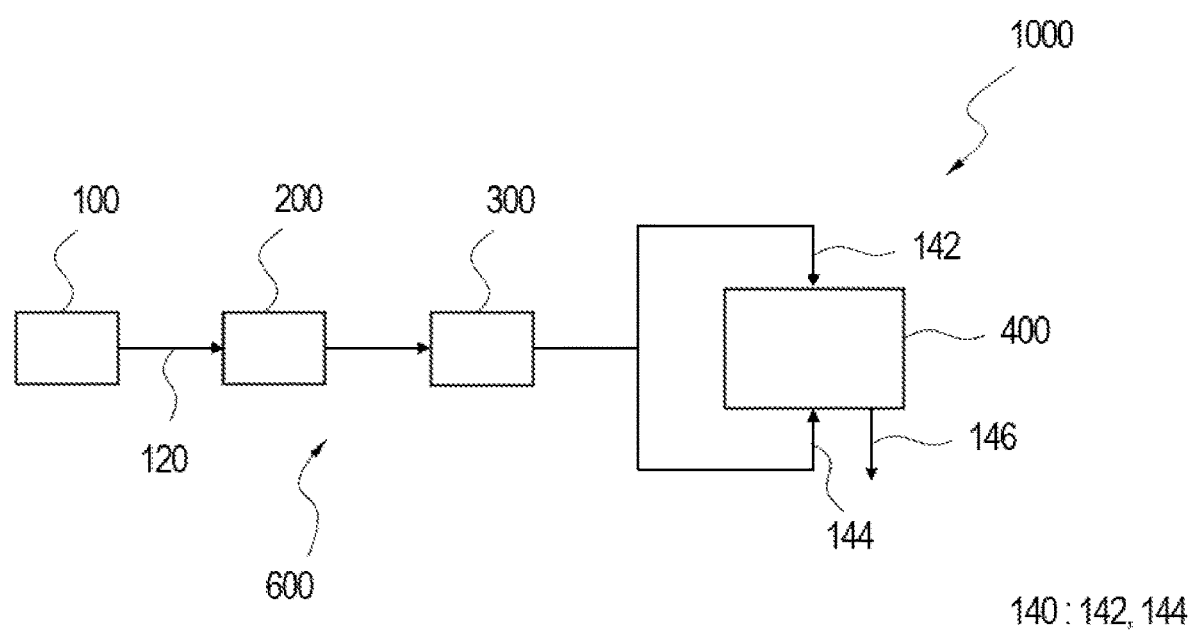
FIG. 1 is a block diagram illustrating the configuration of a substrate processing apparatus according to an embodiment of the present disclosure.
Figure 2:
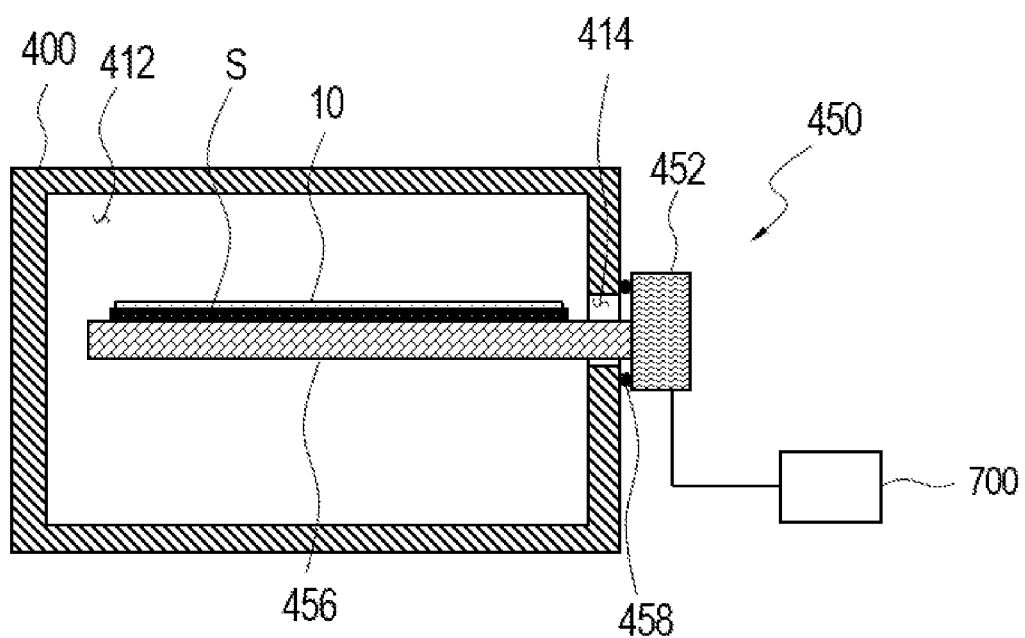
FIG. 2 is a side cross-sectional view showing the configuration of a chamber according to an embodiment of the present disclosure.

FIG. 1 is a block diagram illustrating the configuration of a substrate processing apparatus 1000 according to an embodiment of the present disclosure. FIG. 2 is a side cross-sectional view showing the configuration of a chamber 400.

The substrate processing apparatus 1000 according to the present disclosure performs a process for a substrate S using a supercritical fluid. Here, the supercritical fluid corresponds to a fluid having a phase formed when a material reaches a critical state, that is, a state that exceeds a critical temperature and a critical pressure. The supercritical fluid has a property with a molecular density close to liquid and a viscosity close to gas. Therefore, because the supercritical fluid is advantageous for chemical reactions because of excellent diffusion force, permeability force and dissolution ability and has little surface tension, the supercritical fluid may not apply surface tension to a microstructure, and thus may have excellent dry efficiency during a drying process of a semiconductor device and may avoid pattern collapse to be used very useful.

In the present disclosure, carbon dioxide ($CO_2$) may be used as a supercritical fluid. $CO_2$ has a critical temperature of about 31.1° C. and a relatively low critical pressure of about 7.38 MPa, and thus it is advantageous that $CO_2$ is easily made to a supercritical state, the state thereof is controlled by adjusting the temperature and the pressure, and $CO_2$ is cheap.

$CO_2$ is not toxic, and thus is harmless to the human body and is non-combustible and inert. Because $CO_2$ in a supercritical state has a diffusion coefficient that is about 10 to about 100 times higher than that of water or other organic solvents, $CO_2$ in a supercritical state has excellent permeability, allows rapid replacement of organic solvents, and has almost no surface tension, and thus has properties advantageous for use in a drying process. It may be possible to convert $CO_2$ used in the drying process into a liquid state and separate and reuse organic solvents, which has less burden in terms of environmental pollution.

Referring to FIGS. 1 and 2, the substrate processing apparatus 1000 may include the chamber 400 providing a processing space 412 in which a process is performed on the substrate S coated with a processing liquid or an organic solvent 10 (hereinafter referred to as 'organic solvent') using a supercritical fluid, and a fluid supply 600 configured to supply a liquid into the chamber 400.

The fluid supply 600 may adjust at least one of the temperature and pressure of a fluid and supply the fluid to the chamber 400 through a fluid supply port 140.

For example, the fluid supply 600 may include a fluid storage 100 configured to store the fluid and a main supply flow path 120 connecting the fluid storage 100 and the fluid supply port 140.

In this case, a pressure adjuster 200 and a temperature adjuster 300 may be disposed along the main supply flow path 120. In this case, the pressure adjuster 200 may be configured as, for example, a pressure pump, and the temperature adjuster 300 may include a heater or a heat exchanger for heating the fluid.

The main supply flow path 120 may further include a detector (not shown) configured to detect at least one of the pressure and temperature of the fluid. The pressure and temperature of the fluid flowing along the main supply flow path 120 may be adjusted according to the pressure and temperature detected by the detector. To this end, the substrate processing apparatus 1000 according to an embodiment of the present disclosure may include a controller (not shown) configured to control the pressure adjuster 200 and the temperature adjuster 300. The controller may control the pressure adjuster 200 and the temperature adjuster 300 based on the pressure and temperature detected by the detector.

When the process is performed on the substrate S, an internal environment of the processing space 412 of the chamber 400, that is, the temperature and pressure of the processing space 412 needs to be created as an environment above the critical temperature and critical pressure at which a fluid supplied to the chamber 400 is convertible into a supercritical state and maintained during the current process.

To this end, while the fluid is moved along the main supply flow path 120, the pressure adjuster 200 may pressurize the fluid at the critical pressure or more and also the temperature adjuster 300 may heat the fluid at the critical temperature or more.

The fluid supply port 140 may include an upper supply port 142 connected to an upper portion of the chamber 400 and a lower supply port 144 connected to a lower portion of the chamber 400.

For example, the main supply flow path 120 described above may be branched and the branched paths may be connected to an upper supply port 142 and a lower supply port 144, respectively. In this case, although not shown in the drawing, valves may be provided at front ends of the upper supply port 142 and the lower supply port 144 to control supply of the fluid.

When the fluid is supplied at the beginning of the process through an upper portion of the chamber 400, a high-pressure fluid may be supplied to the substrate S from the upper portion of the chamber 400. In this case, a pattern (not shown) formed on the substrate S may be damaged by a high-pressure fluid. Therefore, at the beginning of the process, the fluid is supplied from a lower portion of the chamber 400 through the lower supply port 144 to prevent damage to the pattern on the substrate S. When the fluid is accommodated inside the chamber 400 and the substrate S is immersed by the fluid, for example, the fluid may be supplied from the upper portion of the chamber 400 through the upper supply port 142.

The chamber 400 include at least one discharge port 146 for discharging the fluid of the processing space 412 to the outside. When a process for the substrate S is currently performed or is completed, the fluid may be discharged from the inside of the chamber 400 to the outside through the discharge port 146.

The chamber 400 may provide the processing space 412 in which a process such as a drying process is performed on the substrate S using the supercritical fluid.

The chamber 400 may be formed with an opening (not shown) at one side and may be made of a material suitable for processing a high-pressure process for the substrate S inside the chamber 400.

The processing space 412 of the chamber 400 may be maintained in a sealed state, and a pressure of the fluid supplied to the processing space 412 may be maintained at a critical pressure or more.

The chamber 400 may further include a heater (not shown) to maintain the temperature of the processing space 412 at a certain temperature or more. In the process of the substrate S by the heater, the temperature of the processing space 412 or the temperature of the fluid accommodated in the processing space 412 may be maintained above the critical temperature.

The chamber 400 may include a tray unit 450 that supports the substrate S and is provided to be inserted into the chamber 400 and withdraw from the chamber 400 through an opening 414.

The tray unit 450 may be inserted into the processing space 412 of the chamber 400 through the opening 414 or withdraw from the chamber 400 through the opening 414 in the processing space 412.

For example, the tray unit 450 may include a tray 456 supporting the substrate S and a cover 452 provided at an end of the tray 456 and sealing the opening 414.

The substrate S may be placed and supported by an upper surface of the tray 456. The cover 452 may be connected to the end of the tray 456.

When the tray 456 is inserted into the processing space 412 through the opening 414, the cover 452 may seal the opening 414. In this case, to seal between the cover 452 and the chamber 400, a sealing member 458 may be provided.

When a process such as a drying process for the substrate is performed using a supercritical fluid, pressurization and depressurization are repeated using a high-pressure fluid of about 10 MPa or more in the chamber, and thus it is not easy to accurately detect a progress of the process or an end point of the process. This is because it is difficult to accurately measure the remaining amount of an organic solvent such as isopropyl alcohol (IPA) on the substrate located inside the chamber 400.

According to the present disclosure, to resolve the aforementioned problem, provided is a detector that measures a resistance of the substrate S to detect at least one of a process progress for the substrate S and the amount of the organic solvent 10 on the substrate S.

That is, the detector 700 measures a resistance of the tray unit 450 or the substrate S to detect at least one of a process progress for the substrate S and the amount of the organic solvent 10 on the substrate S.

In general, a resistance R represents a degree by which a current flow is interrupted when a certain voltage is applied, and is expressed as [Equation 1] below.

$$R = \rho L/A \qquad \text{[Equation 1]}$$

Here, 'ρ' corresponds to a specific resistance, which is a unique physical property of an object through which current passes, 'L' represents a length of the object, and 'A' represents a cross-sectional area of the object. Therefore, the resistance R increases as the length L increases in a direction of current, and as the cross-sectional area A perpendicular to the current increases, the resistance decreases. In other words, the resistance R is proportional to the length L and inherent resistivity ρ of the object and inversely proportional to the cross-sectional area A.

In the above description, a resistance of the substrate S itself and a resistance of the substrate S in a state of being coated with the organic solvent 10 are different from each other, and in particular, the amount of the organic solvent 10 applied to the substrate S is changed, the resistance of the substrate S changes. Therefore, when it is possible to measure the resistance of the substrate S, a progress of the process for the substrate S and the amount of the organic solvent 10 may be measured.

Figure 3:
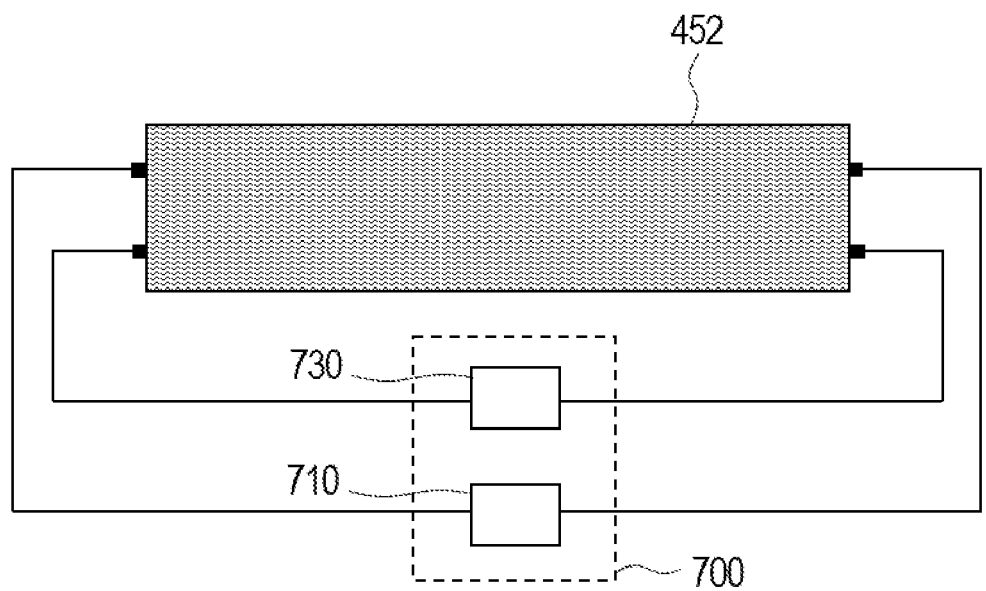
FIG. 3 is a front view showing the configuration of a detector according to an embodiment of the present disclosure.

FIG. 3 is a front view showing the configuration of the detector 700 according to an embodiment of the present disclosure. In FIG. 3, only the cover 452 described above is shown for convenience of description.

Referring to FIGS. 2 and 3, the detector 700 measures the resistance of the substrate S with the tray unit 450.

For example, the detector 700 may be connected to the cover 452 of the tray unit 450. The detector 700 may include an ammeter 710 that measures a current of an object and a voltmeter 730 that measures a voltage. That is, the detector 700 may include the ammeter 710 connected to the cover 452 to measure the current of the tray unit 450 and the voltmeter 730 connected to the cover 452 to measure the voltage of the tray unit 450.

The detector 700 may calculate the resistance of the tray unit 450 by measuring the voltage and current of the tray unit 450 by the ammeter 710 and the voltmeter 730.

In this case, the resistance of the substrate S may be measured when the substrate S is loaded on the tray 456 by measuring the resistance of the tray unit 450 with the cover 452.

In other words, if a resistance value of the tray unit 450 is known in advance when the substrate S is not loaded on the tray 456, a resistance after the substrate S is loaded on the tray 456 may be measured and the resistance of the substrate S may be measured.

According to an experiment of the present inventor, when the substrate S coated with the organic solvent 10 is loaded on the tray 456, the current state may correspond to a state in which the tray 456 and the substrate S are electrically connected in parallel, and thus the resistance decreases, and as the process for the substrate S is performed and the amount of the organic solvent 10 decreases, the resistance value increases. Changes in resistance value during this process for the substrate S will be described in detail below.

FIGS. 4A to 4D are diagrams illustrating a procedure for processing the substrate S using the detector 700 according to an embodiment of the present disclosure. FIG. 5 is a graph illustrating a change in resistance value measured by the detector 700 according to a process for the substrate S.

FIG. 5 shows a measured resistance value straightly or linearly and is a graph showing an example of a change pattern of a resistance value during a process for the substrate S, and when the resistance value is actually measured, a curved or non-linear measurement value may be achieved.

Hereinafter, the present disclosure will be described with reference to FIG. 4A through FIG. 5.

A substrate monitoring method according to the present disclosure may include measuring resistance of the substrate S, and detecting at least one of a progress of a process for the substrate S and the amount of the organic solvent 10 on the substrate S according to the measured resistance value.

Figure 4A:
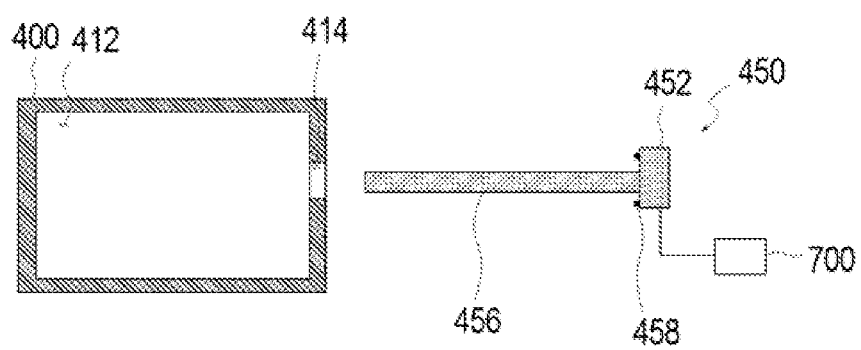
FIGS. 4A to 4D are diagrams illustrating a procedure for processing a substrate using a detector according to an embodiment of the present disclosure.
Figure 5:
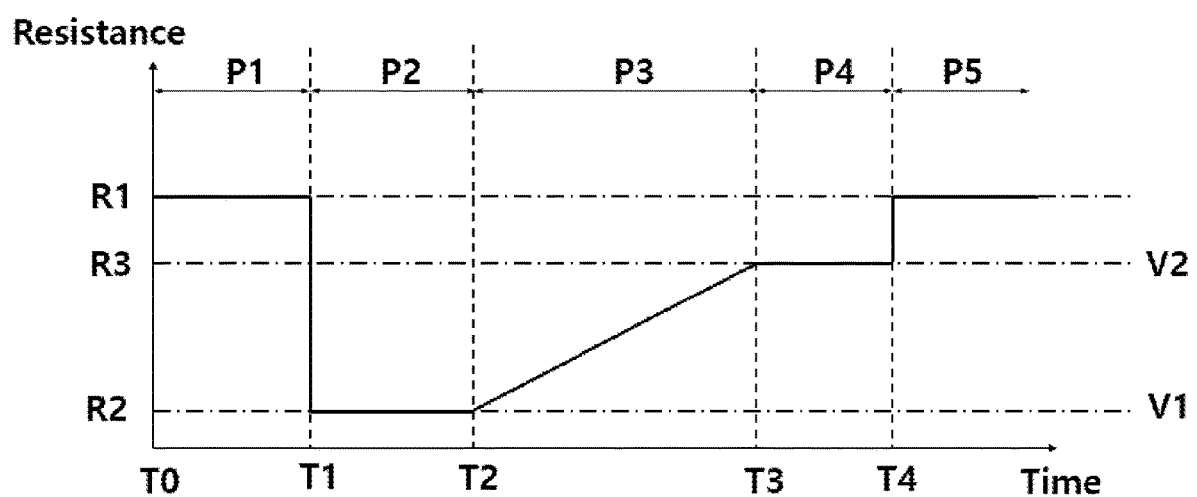
FIG. 5 is a graph illustrating a change in resistance value measured by a detector according to a process for the substrate.

First, referring to FIG. 4A, in a preparation operation P1: T0 to T1 before a process for the substrate S is performed, the tray unit 450 is undocked or separated from the chamber 400. In this case, as shown in FIG. 5, a first resistance value R1 measured by the detector 700 until the substrate S is loaded on the tray unit 450 corresponds to a resistance value of the tray unit 450 itself and corresponds to a state in which a resistance value of the substrate S is not applied. The resistance value of the tray unit 450 itself may be measured in advance and stored in advance in a controller unit (not shown) or the detector 700.

Figure 4B:
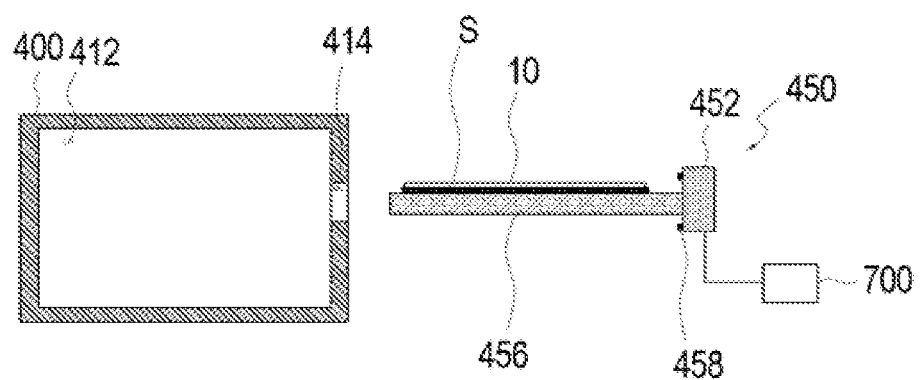

Then, the substrate S coated with the organic solvent 10 is loaded into the tray 456, as shown in FIG. 4B. In this case, when the resistance value is measured by the detector 700, the tray 456 and the substrate S coated with the organic solvent 10 are electrically connected in parallel. Accordingly, a second resistance value R2 measured by the detector 700 may be reduced from the first resistance value R1 measured in the previous operation P1.

Figure 4C:
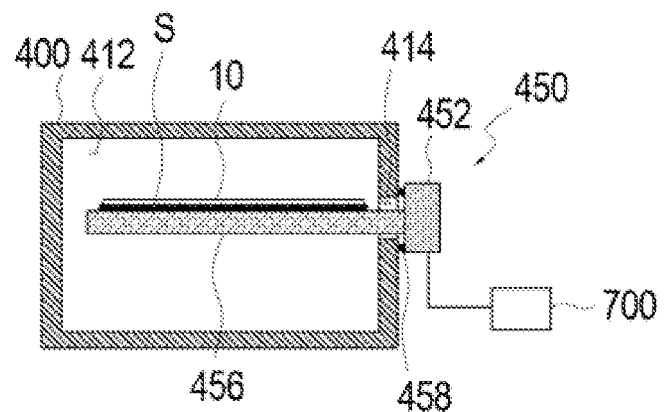

After the substrate S is loaded into the tray 456, the tray unit 450 is docked or coupled to the chamber 400, as shown in FIG. 4C. In FIG. 5, operation P2 of 'T1 to T2' corresponds to the processes of FIG. 4B and FIG. 4C described above. In this case, the resistance value measured by the detector 700 corresponds to the second resistance value R2 described above.

The detector 700 may compare the second resistance value R2, which is measured when the substrate S coated with the organic solvent 10 is loaded into the tray unit 450, with a predetermined first threshold value V1 to determine whether an amount of the organic solvent 10 corresponding to a required amount (or a predetermined amount) is applied to the substrate S.

In other words, to perform a drying process for the substrate S, the organic solvent 10 corresponding to the required amount needs to be applied to an upper surface of the substrate S. However, due to various factors in the process, a less amount than the required amount of the organic solvent 10 may be applied onto the substrate S. In this case, the process for the substrate S may not proceed smoothly, and damage such as pattern collapse on the substrate S may occur. Conversely, when a more amount than the required amount of the organic solvent 10 is applied onto the substrate S, a residue may be generated after the drying process.

The first threshold value V1 may be determined by adding a predetermined margin to a resistance value of the substrate S on which the required amount of the organic solvent 10 is applied.

In this case, a user may arbitrarily adjust an offset by adjusting the aforementioned margin. For example, when the first threshold value is applied excessively strictly, the process may not proceed smoothly, and thus the process may be made more easily by adding a margin to the first threshold value. This margin may not discriminate between positive and negative values and may also be presented as a numeric range.

When the apparatus according to the present disclosure is used for a long time, the measured resistance value may change, and thus a malfunction due to equipment aging may be prevented by adjusting the margin.

The first threshold value V1 may be measured in advance and stored in the detector 700 or a controller (not shown).

Thus, if the second resistance value R2, which is measured when the substrate S coated with the organic solvent 10 is loaded into the tray unit 450, is greater than the predetermined first threshold value V1, the detector 700 may inform an operator that the amount of the organic solvent 10 applied to the substrate S is less than the required amount, through a display (not shown).

When the measured second resistance value R2 is less than the predetermined first threshold value V1, the process for the substrate S is further processed to remove the organic solvent 10 to prevent residues from forming, as described below.

If the second resistance value R2, which is measured when the substrate S is loaded into the tray unit 450, is equal to or less than the predetermined first threshold value V1, the drying process for the substrate S may be performed P3: T2 to T3.

When the drying process for the substrate S proceeds, the amount of the organic solvent 10 applied to the substrate S decreases, and the resistance value measured by the detector 700 increases as shown in operation 'P3' of FIG. 5.

If a third resistance value R3 measured during the process for the substrate S is equal to or greater than a predetermined second threshold value V2, the detector 700 may determine that the process for the substrate S is completed.

In this case, the second threshold value V2 may be determined by adding a predetermined margin to the resistance value of the substrate S from which the organic solvent 10 is removed.

Thus, when the third resistance value R3 measured by the detector 700 is equal to or greater than the predetermined second threshold value V2, the organic solvent 10 applied onto the substrate S may be removed, and the detector 700 may determine that the process for the substrate S is completed.

Figure 4D:
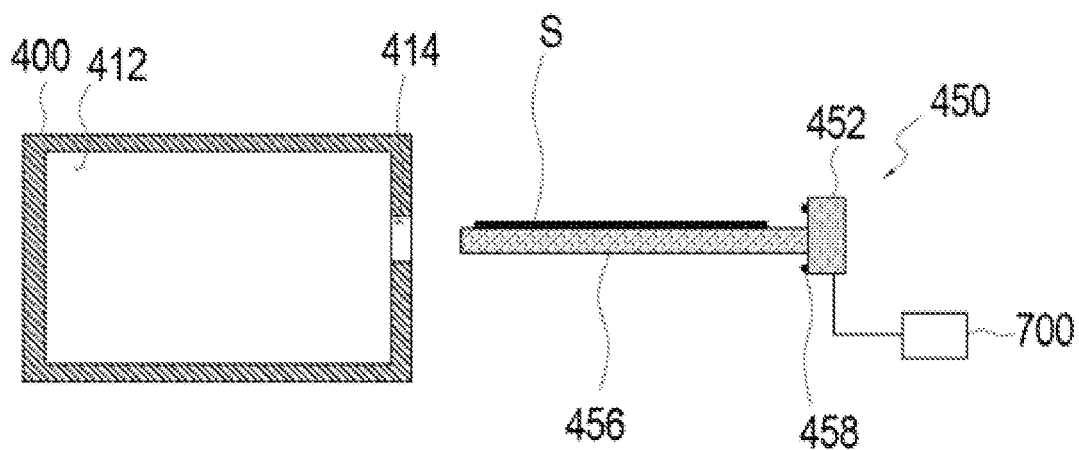

In this case, as shown in FIG. 4D, the tray unit 450 is separated from the chamber 400, and as shown in FIG. 5 (P4: T3 to T4), the third resistance value R3 measured with the tray unit 450 remains approximately constant.

Then, when the substrate S is unloaded from the tray 456 (P5: T4 to), the resistance value measured with the detector 700 increases to the first resistance value R1 in the previous preparation operation P1.

Figure 6:
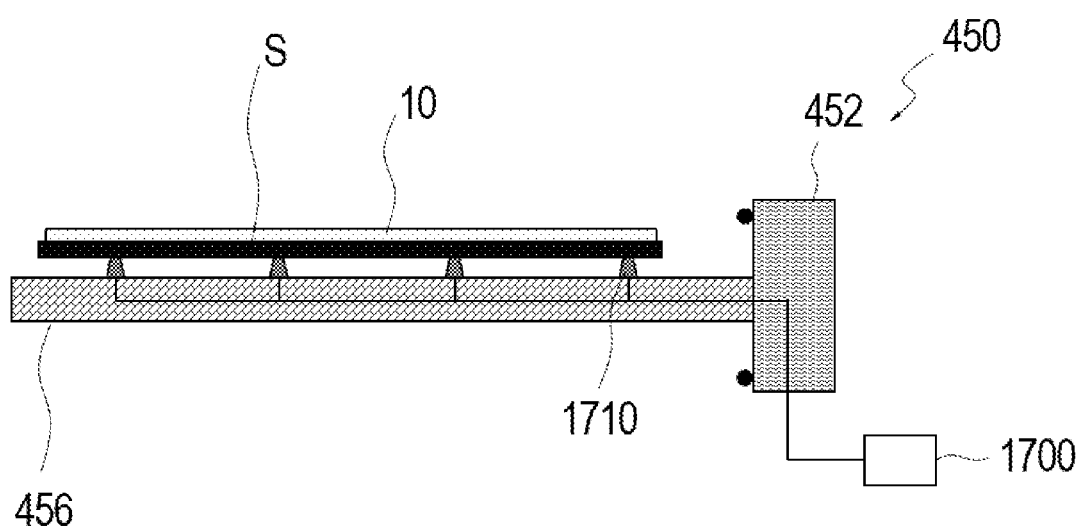
FIG. 6 shows the configuration of a detector and is a side view of a tray unit, according to another embodiment of the present disclosure.

FIG. 6 shows the configuration of a detector 1700 and is a side view of the tray unit 450, according to another embodiment of the present disclosure.

Referring to FIG. 6, the detector 1700 directly measures the resistance of the substrate S with the tray unit 450.

For example, the detector 1700 may include a plurality of protruding terminals 1710 protruding from an upper surface of the tray 456. When the substrate S is loaded into the tray 456, the substrate S is placed on the upper end of the protruding terminal 1710, and thus the resistance of the substrate S may be directly measured with the protruding terminal 1710. An installation location of the protruding terminal 1710 described above may be appropriately modified.

FIGS. 7A to 7D show arrangement of the protruding terminals 1710 in the aforementioned detector 1700 and is a plan view of the tray unit 450.

Figure 7A:
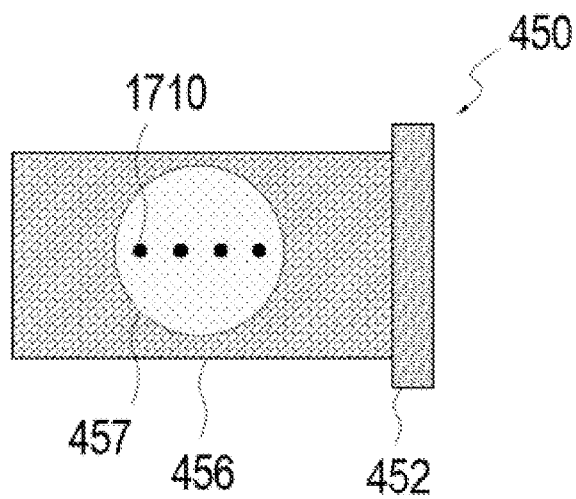
FIGS. 7A to 7D show arrangement of protruding terminals in a detector and is a plan view of a tray unit.
Figure 7B:
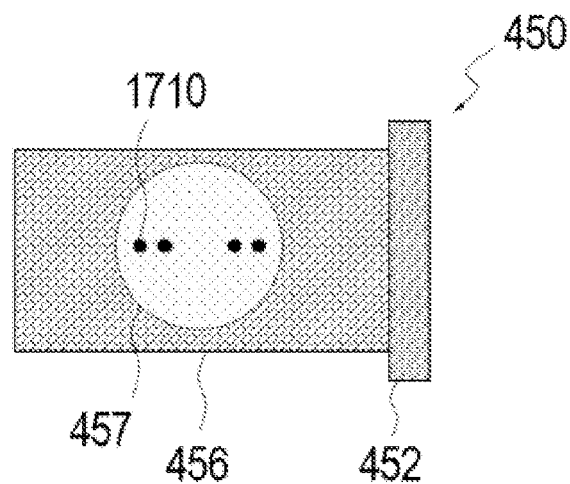
Figure 7C:
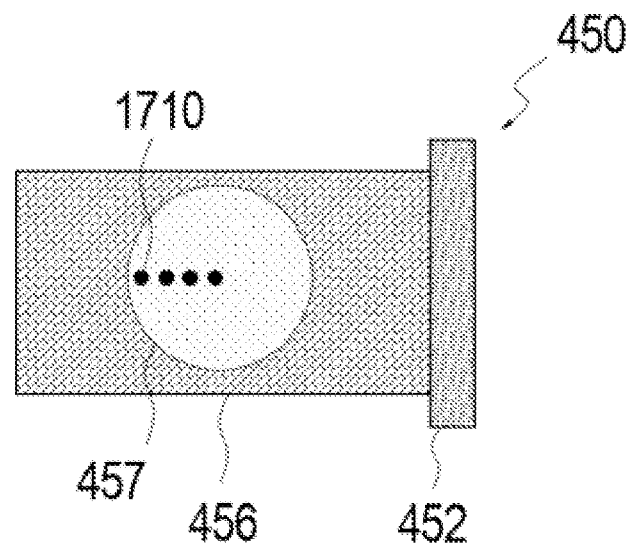
Figure 7D:
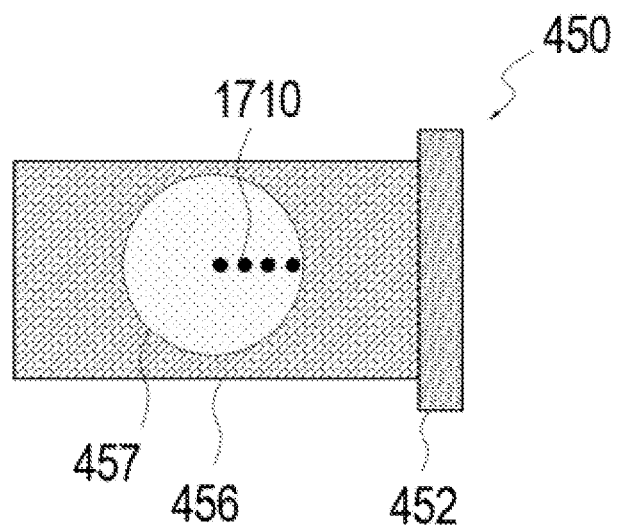

Referring to FIGS. 7A to 7D, the protruding terminals 1710 may be arranged at equal intervals along the center of an accommodation portion 457 on which the substrate S placed, as shown in FIG. 7A, or may be arranged to be spaced apart on both sides from the center of the accommodation portion 457, as shown in FIG. 7B. The protruding terminal 1710 may be centrally arranged on one side of the central portion of the accommodation portion 457, as shown in FIGS. 7C and 7D.

An installation location of the protruding terminal 1710 described above may be appropriately modified in various ways. For example, the location of the protruding terminal 1710 may be determined through a process condition of the chamber 400 or a text process of the chamber 400.

Although not shown in the drawing, a protrusion including an insulator in addition to the protruding terminal 1710 may be further provided at a position offset from the arrangement of the protruding terminal 1710. The substrate S in contact with the protruding terminal 1710 arranged in a row may be prevented from being tilted by the protrusion.

FIGS. 8A to 8D are diagrams illustrating a sequence of a process for the substrate S using the detector 1700 according to the aforementioned embodiment. The present disclosure will be described with reference to FIG. 5 through FIG. 8D.

Figure 8A:
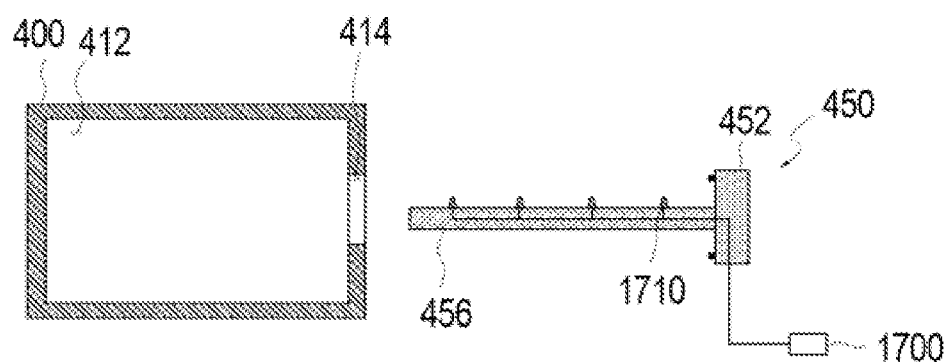
FIGS. 8A to 8D are diagrams illustrating a sequence of a process for a substrate using a detector according to the aforementioned embodiment.

Referring to FIG. 8A, before the process for the substrate S is performed, the tray unit 450 is undocked or separated from the chamber 400 P1: T0 to T1. In this case, referring to FIG. 5, the substrate S is not loaded on the protruding terminal 1710 of the detector 1700, and thus the first resistance value R1 is measured by the detector 1700.

Figure 8B:
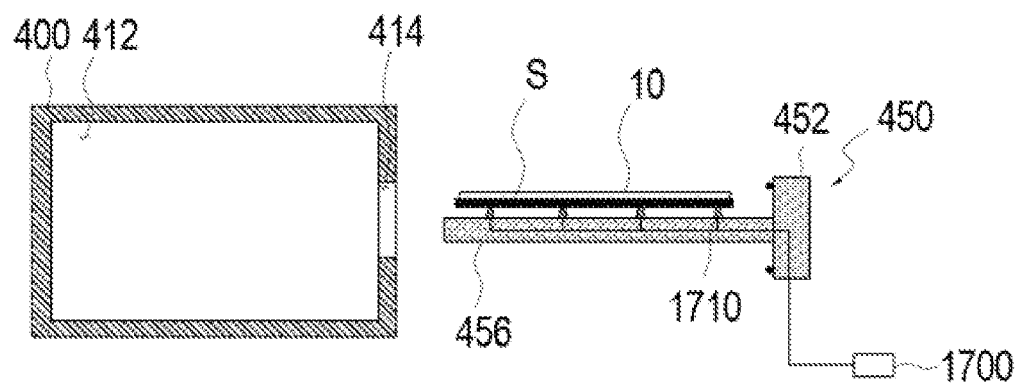

Then, the substrate S on which the organic solvent 10 is applied is loaded into the tray 456, as shown in FIG. 8B. The second resistance value R2 measured by the detector 700 may be reduced from the first resistance value R1 measured in the previous operation P1.

Figure 8C:
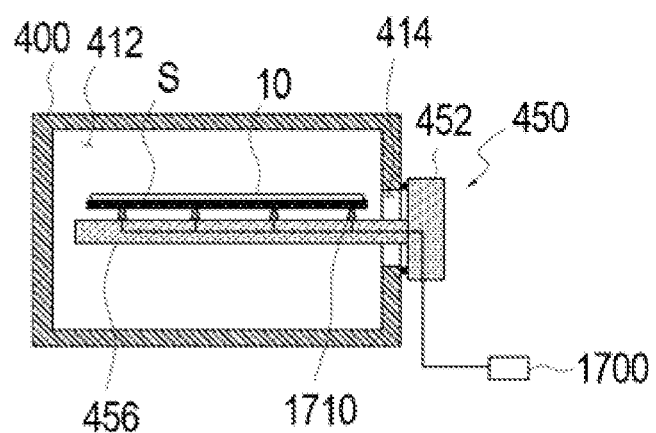

After the substrate S is loaded into the tray 456, the tray unit 450 is docked into the chamber 400, as shown in FIG. 8C. In FIG. 5, operation P2 of 'T1 to T2' corresponds to the processes of FIG. 8B and FIG. 8C described above. In this case, the resistance value measured by the detector 1700 with the protruding terminal 1710 corresponds to the second resistance value R2 described above.

The detector 1700 compares the measured second resistance value R2, which is measured hen the substrate S on which the organic solvent 10 is applied is loaded on the tray unit 450, with the predetermined first threshold value V1 and calculates whether the required amount of organic solvent 10 is applied to the substrate S.

The first threshold value V1 may be determined with a predetermined margin to the resistance value in a state in which the required amount of organic solvent 10 is applied to the substrate S. The first threshold value V1 may be measured in advance and stored in the detector 1700 or a controller (not shown).

Thus, if the second resistance value R2, which is measured when the substrate S on which the organic solvent 10 is applied is loaded into the tray unit 450, is greater than the predetermined first threshold value V1, the detector 1700 may inform an operator that the amount of the organic solvent 10 applied to the substrate S is less than the required amount, through a display (not shown).

When the measured second resistance value R2 is less than the predetermined first threshold value V1, the process for the substrate S is further processed to remove the organic solvent 10 to prevent residues from forming, as described below.

If the second resistance value R2, which is measured when the substrate S is loaded into the tray unit 450, is equal to or less than the predetermined first threshold value V1, the drying process for the substrate S may be performed P3: T2 to T3.

When the drying process for the substrate S proceeds, the amount of the organic solvent 10 applied to the substrate S decreases, and the resistance value measured by the detector 1700 increases as shown in operation 'P3' of FIG. 5.

If the third resistance value R3 measured during the process for the substrate S is equal to or greater than the predetermined second threshold value V2, the detector 1700 may determine that the process for the substrate S is completed.

In this case, the second threshold value V2 may be determined by adding a predetermined margin to the resistance value in a state in which an organic solvent is not applied to the substrate S.

Thus, when the third resistance value R3 measured by the detector 1700 is equal to or greater than the predetermined second threshold value V2, the organic solvent 10 applied onto the substrate S may be removed, and the detector 1700 may determine that the process for the substrate S is completed.

Figure 8D:
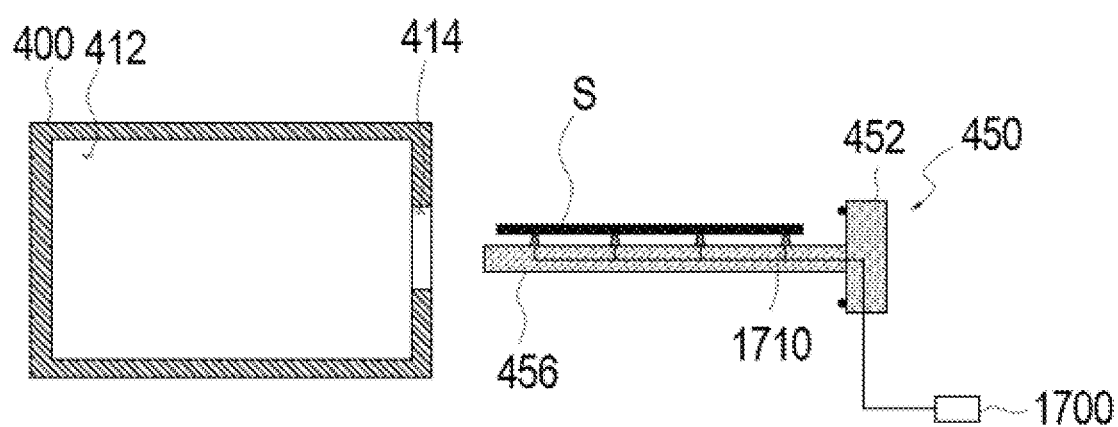

In this case, as shown in FIG. 8D, the tray unit 450 is separated from the chamber 400, and as shown in FIG. 5 (P4: T3 to T4), the third resistance value R3 measured with the tray unit 450 remains approximately constant.

Then, when the substrate S is unloaded from the tray 456 (P5: T4 to), the resistance value measured with the detector 1700 increases to the first resistance value R1 in the previous preparation operation P1.

Figure 9:
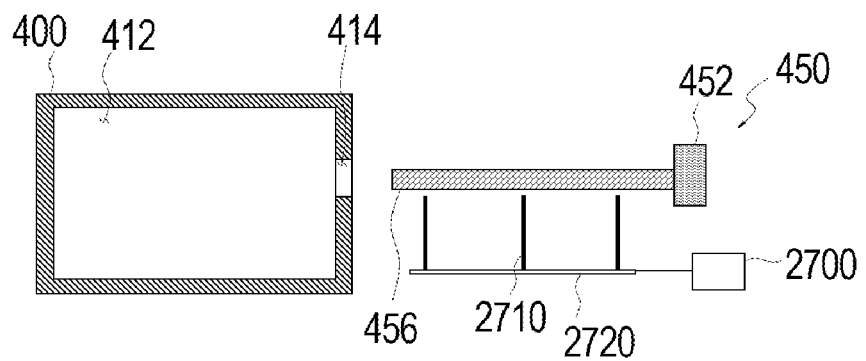
FIG. 9 shows the configuration of a detector and is a side view of a chamber, according to another embodiment of the present disclosure.

FIG. 9 shows the configuration of a detector 2700 and is a side view of a chamber, according to another embodiment of the present disclosure.

Referring to FIG. 9, the substrate processing apparatus 1000 may further include a lift pin 2710 that loads the substrate S into the tray unit 450 or unloading the substrate S from the tray unit 450.

For example, the lift pin 2710 may be connected to an elevating plate 2720, and the elevating plate 2720 may be raised and lowered by a driver (not shown). When the elevating plate 2720 rises, the lift pin 2710 may protrude to an upper portion of the tray 456 through a pinhole (not shown) of the tray 456.

The detector 2700 is connected to the lift pin 2710 and directly measures the resistance of the substrate S.

FIGS. 10A to 10F are diagrams illustrating a sequence of a process for the substrate S using the detector 2700 according to the aforementioned embodiment.

Figure 10A:
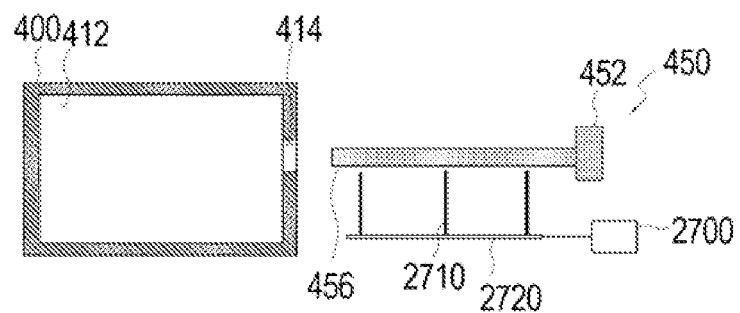
FIGS. 10A to 10F are diagrams illustrating a sequence of a process for a substrate using a detector according to the aforementioned embodiment.

A preparation operation of FIG. 10A, the lift pin 2710 may be located below the tray 456.

In this case, referring to FIG. 5, the substrate S is not placed on the lift pin 2710, and thus the first resistance value R1 is measured by the detector 2700.

Figure 10B:
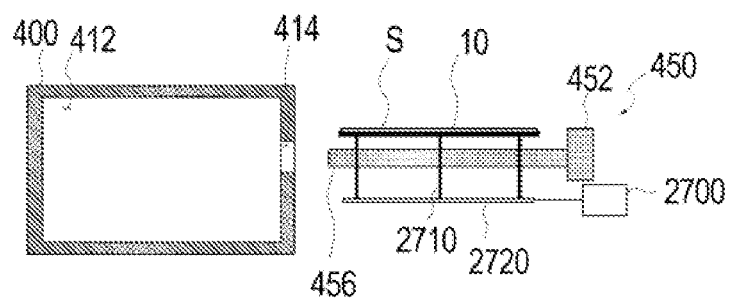

Then, as shown in FIG. 10B, the lift pin 2710 may be raised through the tray 456, and the substrate S onto which the organic solvent 10 is applied is placed on an upper end of the lift pin 2710.

In this case, the resistance value measured by the detector 1700 with the lift pin 2710 corresponds to the second resistance value R2 reduced from the first resistance value R1.

The detector 2700 may compare the second resistance value R2, which is measured when the substrate S onto which the organic solvent 10 is applied is placed on the lift pin 2710, with the predetermined first threshold value V1 to determine whether the organic solvent 10 corresponding to the required amount is applied to the substrate S.

The first threshold value V1 may be determined with a predetermined margin in a resistance value in a state in which the required amount of the organic solvent 10 is applied to the substrate S. The first threshold value V1 may be measured in advance and stored in advance in the detector 2700 or a controller (not shown).

Thus, if the second resistance value R2, which is measured when the substrate S on which the organic solvent 10 is applied is placed on the lift pin 2710, is greater than the predetermined first threshold value V1, the detector 2700 may inform an operator that the amount of the organic solvent 10 applied to the substrate S is less than the required amount, through a display (not shown).

When the measured second resistance value R2 is equal to or less than the predetermined first threshold value V1, a subsequent process may be performed.

Figure 10C:
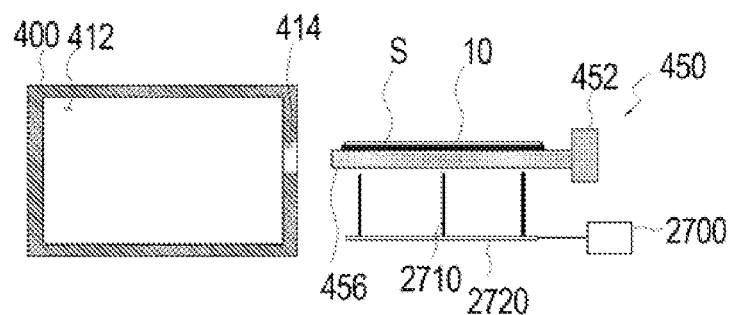
Figure 10D:
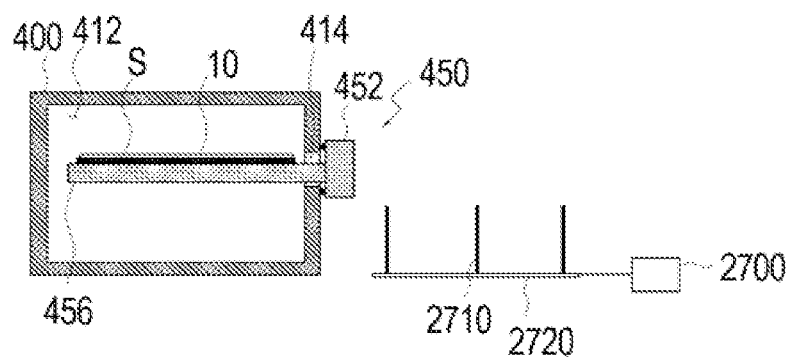

For example, as shown in FIG. 10C, when the lift pin 2710 is lowered to load the substrate S into the tray 456, the tray unit 450 may be coupled to the chamber 400 and the process for the substrate S may be performed, as shown in FIG. 10D.

Figure 10E:
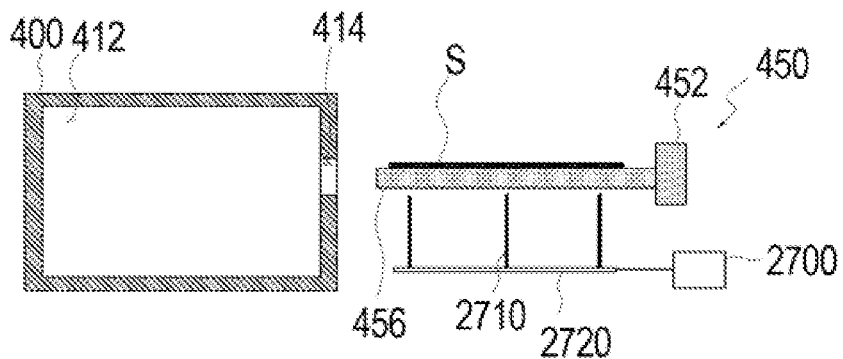
Figure 10F:
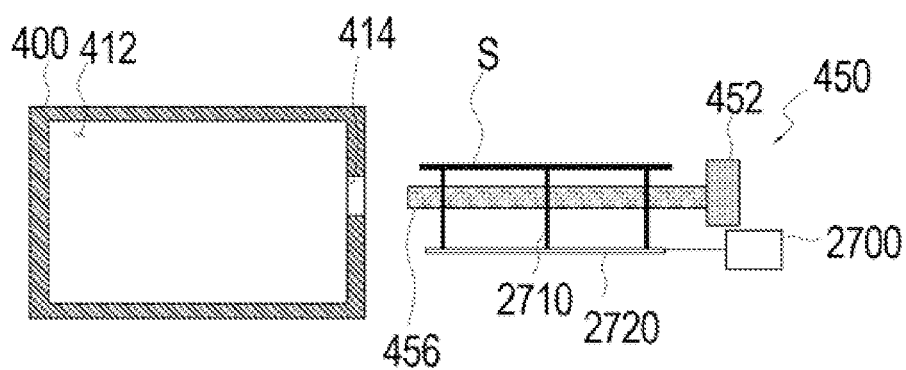
Figure 11:
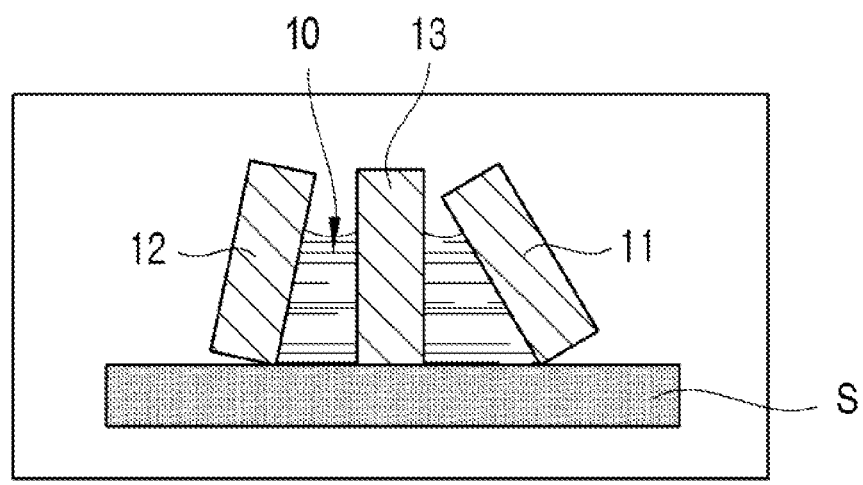
FIG. 11 is a schematic diagram showing a state in which a pattern collapses when a pattern on a substrate is dried according to the related art.
Figure 12:
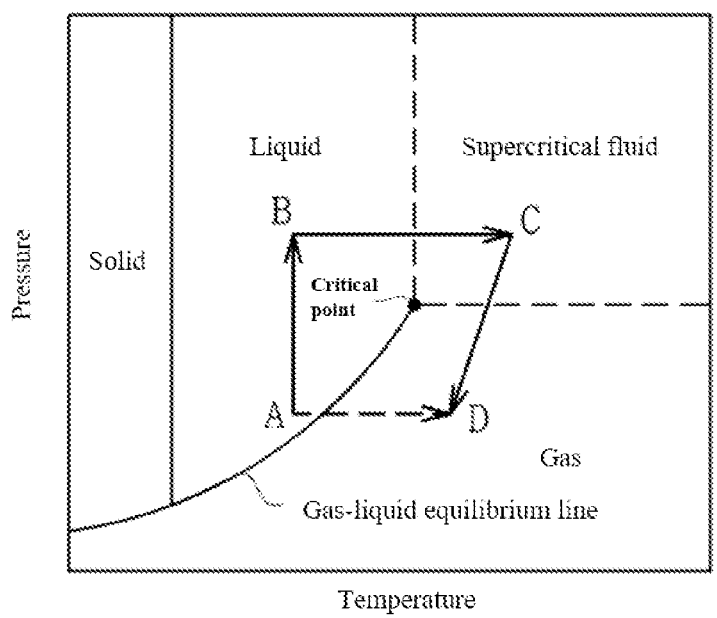
FIG. 12 is a state diagram showing a change in pressure and temperature of a fluid in a process using a supercritical fluid.

Then, when the process for the substrate S is completed, as shown in FIG. 10E, the tray unit 450 is separated from the chamber 400, and the lift pin 2710 is raised to accommodate the substrate S from which the organic solvent 10 is removed, on the upper end of the lift pin 2710, as shown in FIG. 10F.

As shown in FIG. 10F, when the process for the substrate S is completed and the substrate S is placed on the upper end of the lift pin 2710 again, the resistance value of the substrate S may be measured by the detector 2700.

In this case, the measured resistance value corresponds to the third resistance value R3 in FIG. 5 and corresponds to the resistance value of the substrate S from which the organic solvent 10 is removed.

According to the present embodiment, the measured third resistance value R3 may be compared with the predetermined second threshold value V2 to check whether the drying process for the substrate S is normally performed.

That is, the second threshold value V2 may be determined by adding a predetermined margin to the resistance value in a state in which an organic solvent is not applied to the substrate S.

Accordingly, when the measured third resistance value R3 and the second threshold value V2 are compared with each other and the measured third resistance value R3 is less than the second threshold value V2, it may be determined that the organic solvent 10 remains in the substrate S. When the measured third resistance value R3 is equal to or greater than the second threshold value V2, it may be checked that the organic solvent 10 of the substrate S is removed and the process is normally performed.

According to the present disclosure having the aforementioned configuration, the resistance value or specific resistance value that is varied depending on the amount of an organic solvent applied on the substrate may be measured to determine a progress of the process in real time to check whether the process is smoothly performed.

According to the present disclosure, it may be possible to accurately detect an end point of a substrate process and quickly proceed with a subsequent process when a process for the substrate is completed, thereby reducing a processing time for the substrate and increasing processing efficiency.

Although the present disclosure has been described above with reference to exemplary embodiments, those skilled in the art may modify and change the present disclosure in various ways without departing from the spirit and scope of the present disclosure as set forth in the claims described below. Therefore, when the modified implementation basically includes the elements of the claims of the present disclosure, it should be considered to be included in the technical scope of the present disclosure.

What is claimed is:
1. A substrate processing apparatus comprising:
 a chamber providing a processing space in which a process is performed on a substrate coated with an organic solvent using a fluid in a supercritical state;

a tray unit supporting the substrate and provided to be inserted into the chamber and withdrawn from the chamber through an opening of the chamber; and a detector configured to measure a resistance of the substrate, wherein the tray unit includes a tray supporting the substrate, and a cover provided at an end of the tray and sealing the opening, and the detector is connected to the cover.

2. The substrate processing apparatus of claim 1, wherein the detector detects at least one of a progress of the process for the substrate and an amount of the organic solvent on the substrate.

3. The substrate processing apparatus of claim 1, wherein the detector measures the resistance of the substrate with the tray unit.

4. The substrate processing apparatus of claim 1, wherein the detector includes an ammeter configured to measure a current and a voltmeter configured to measure a voltage.

5. A substrate processing apparatus comprising:

a chamber providing a processing space in which a process is performed on a substrate coated with an organic solvent using a fluid in a supercritical state;

a tray unit supporting the substrate and provided to be inserted into the chamber and withdrawn from the chamber through an opening of the chamber; and a detector configured to measure a resistance of the substrate, wherein the tray unit includes a tray supporting the substrate, and a plurality of protruding terminals that protrude from an upper surface of the tray and are connected to the detector and on which the substrate is placed.

6. The substrate processing apparatus of claim 5, wherein the detector detects at least one of a progress of the process for the substrate and an amount of the organic solvent on the substrate.

7. The substrate processing apparatus of claim 5, wherein the detector measures the resistance of the substrate with the tray unit.

8. The substrate processing apparatus of claim 5, wherein the detector includes an ammeter configured to measure a current and a voltmeter configured to measure a voltage.

* * * * *